United States Patent
Cho et al.

(10) Patent No.: US 9,984,945 B2
(45) Date of Patent: May 29, 2018

(54) SEMICONDUCTOR CHIP

(71) Applicant: Samsung Electronics Co., Ltd., Suwon-si, Gyeonggi-do (KR)

(72) Inventors: Yun-Rae Cho, Suwon-si (KR); Sun-Dae Kim, Hwaseong-si (KR); Nam-Gyu Baek, Suwon-si (KR); Hyung-Gil Baek, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/219,457

(22) Filed: Jul. 26, 2016

(65) Prior Publication Data

US 2017/0062293 A1    Mar. 2, 2017

(30) Foreign Application Priority Data

Sep. 1, 2015 (KR) .......................... 10-2015-0123515

(51) Int. Cl.
*H01L 21/66* (2006.01)
*H01L 21/67* (2006.01)
*H01L 23/58* (2006.01)
*G01R 31/28* (2006.01)

(52) U.S. Cl.
CPC ........ *H01L 22/34* (2013.01); *H01L 21/67288* (2013.01); *H01L 23/585* (2013.01); *G01R 31/2856* (2013.01); *G01R 31/2884* (2013.01)

(58) Field of Classification Search
CPC ......... H01L 22/10; H01L 22/12; H01L 22/34; H01L 23/58; H01L 23/585; H01L 21/67288; H01L 2924/3512; H01L 31/2884; G01R 31/2856
See application file for complete search history.

(56) References Cited

U.S. PATENT DOCUMENTS

| 7,247,921 | B2 | 7/2007 | Sugiura et al. |
| 7,649,200 | B1 * | 1/2010 | Miller ............... H01L 22/34 257/415 |
| 7,700,944 | B2 | 4/2010 | Nishizawa |
| 7,755,169 | B2 | 7/2010 | Watanabe et al. |
| 7,888,776 | B2 | 2/2011 | Ogawa et al. |
| 8,890,560 | B2 | 11/2014 | Kaltalioglu |
| 2011/0180922 | A1 | 7/2011 | Chen et al. |

(Continued)

FOREIGN PATENT DOCUMENTS

| JP | 2943511 B2 | 8/1999 |
| JP | 2010281625 A | 12/2010 |

*Primary Examiner* — Galina Yushina
(74) *Attorney, Agent, or Firm* — Harness, Dickey & Pierce, P.L.C.

(57) ABSTRACT

A semiconductor chip may include a semiconductor substrate and a crack detection circuit. The semiconductor substrate may include a circuit structure. The crack detection circuit may include main lines and a chamfer lines. The main lines may be formed in the semiconductor substrate to surround the circuit structure. The chamfer lines may be formed in corners of the semiconductor substrate. The chamfer lines may be connected between the main lines. A first angle may be formed between each of the chamfer lines and any one of the two main lines perpendicular to each other. A second angle wider than the first angle may be formed between each of the chamfer lines and the other main line.

8 Claims, 6 Drawing Sheets

(56) References Cited

U.S. PATENT DOCUMENTS

2011/0266541 A1* 11/2011 Yang .................. H01L 22/32
                                                          257/48
2012/0049884 A1* 3/2012 Kaltalioglu ........ G01R 31/2858
                                                         324/762.03
2015/0173134 A1    6/2015 Sadwick

* cited by examiner

SEMICONDUCTOR CHIP

CROSS-RELATED APPLICATION

This application claims priority under 35 USC § 119 to Korean Patent Application No. 2015-0123515, filed on Sep. 1, 2015 in the Korean Intellectual Property Office (KIPO), the contents of which are herein incorporated by reference in their entirety.

BACKGROUND

1. Field

Example embodiments relate to a semiconductor chip. For example, at least some example embodiments relate to a crack detection circuit configured to detect a crack of a semiconductor chip and/or a method of performing same.

2. Description of the Related Art

Generally, a semiconductor chip may include a semiconductor substrate and a circuit structure. Occasionally, a semiconductor chip may also include a crack detection circuit. The crack detection circuit may be formed along an edge of the semiconductor substrate to surround the circuit structure. When a crack generated from a side surface of the semiconductor substrate spreads to the crack detection circuit, a current flowing in the crack detection circuit may change. The crack detection circuit may detect the changed current to recognize the generation of the crack in the semiconductor chip.

According to related arts, when the crack detection circuit detects the crack, the semiconductor chip may be determined to be abnormal. However, in the related art, when the properties of the crack are such that the crack will likely not spread to the circuit structure, the crack detection circuit may determine the semiconductor chip to be abnormal. That is, the semiconductor chip including the normal circuit structure may be determined to be abnormal so that a yield of a semiconductor device may be decreased.

SUMMARY

Example embodiments provide a semiconductor chip that may be capable of reducing a probability of (or, alternatively, preventing) the semiconductor chip including a normal circuit structure from being determined to be abnormal.

According to example embodiments, there may be provided a semiconductor chip.

In some example embodiments, the semiconductor chip may include a semiconductor substrate having a circuit structure therein; and a crack detection circuit including main lines and chamfer lines associated with the semiconductor substrate, the main lines including a first main line and a second main line around the circuit structure, the first main line substantially perpendicular to the second main line, and the chamfer lines connected between the main lines at corners of the semiconductor substrate such that, at least one of the corners, the chamfer lines are inclined with respect to the first main line at a first angle and inclined with respect to the second main line at a second angle, the second angle being greater than the first angle.

In some example embodiments, the first main line extends in a direction substantially parallel to a primary cut direction of a wafer associated with the semiconductor substrate, and the second main line extends in a direction substantially parallel to a secondary cut direction of the wafer.

In some example embodiments, the chamfer lines are shaped in a straight line.

In some example embodiments, the chamfer lines are along an outer surface of the circuit structure.

In some example embodiments, the circuit structure comprises: a chamfer face at a corner of the circuit structure adjacent to the corners of the semiconductor substrate.

In some example embodiments, the chamfer lines are such that a gap between a respective one of the chamfer lines and an outer surface of the circuit structure is uniform.

In some example embodiments, the semiconductor chip may include a guard ring between the crack detection circuit and side surfaces of the semiconductor substrate.

In some example embodiments, the semiconductor chip may include auxiliary guard rings extended from the guard ring at each of the corners such that the each of the auxiliary guard rings are adjacent to respective ones of the chamfer lines.

Some example embodiments relate to a semiconductor chip.

In some example embodiments, the semiconductor chip may include a semiconductor substrate having a circuit structure therein; and a crack detection circuit including main lines and chamfer lines associated with the semiconductor substrate around the circuit structure, the chamfer lines connecting the main lines at corners of the semiconductor substrate such that, at least at a first corner of the corners, a first distance from a first end of a respective one of the chamfer lines to the first corner is shorter than a second distance from a second end of the respective one the chamfer lines to the first corner.

In some example embodiments, a direction from the first end of the respective one of the chamfer lines to the first corner of the semiconductor substrate is substantially parallel to a primary cut direction of a wafer associated with the semiconductor chip, and a direction from the second end of the respective one of the chamfer lines to the first corner of the semiconductor substrate is substantially parallel to a secondary cut direction of the wafer.

In some example embodiments, the chamfer lines are shaped in a straight line.

In some example embodiments, the chamfer lines are along an outer perimeter of the circuit structure.

In some example embodiments, the circuit structure comprises: a chamfer face at a corner of the circuit structure adjacent to the corner of the semiconductor substrate.

In some example embodiments, the semiconductor chip may include a guard ring between the crack detection circuit and side surfaces of the semiconductor substrate.

In some example embodiments, the semiconductor chip may include auxiliary guard rings extended from the guard ring at each of the corners such that each of the auxiliary guard rings are adjacent to outer surfaces of respective ones of the chamfer lines.

Some example embodiments relate to semiconductor chip.

In some example embodiments, the semiconductor chip may include a semiconductor substrate having a first side surface and a second side surface with a first corner of the semiconductor substrate therebetween; and a crack detection circuit including a first main line extending in a first direction parallel to the first side surface and a second main line extending in a second direction parallel to the second side surface with a first chamfer line connected therebetween such that the first chamfer line is asymmetrical with respect to the first corner of the semiconductor substrate.

In some example embodiments, the semiconductor chip may include a power source configured to supply power to the crack detection circuit such that current flows in the first main line and the second main line, if the first main line and the second main line are not broken.

In some example embodiments, the first chamfer line is asymmetrical such that a first distance from the first corner to a point where the first chamfer line contacts the first main line is less than a second distance from the first corner to a second point where the first chamfer line contacts the second main line.

In some example embodiments, a first angle between the first main line and the first chamfer line is greater than a second angle between the second main line and the first chamfer line.

In some example embodiments, the first direction corresponds to a primary cut direction and the second direction corresponds to a secondary cut direction of a wafer associated with the semiconductor substrate.

In some example embodiments, the semiconductor substrate further includes a third side surface and a fourth side surface with a second corner of the semiconductor substrate therebetween; and the crack detection circuit further includes a third main line extending in the first direction and a fourth main line extending in a third direction parallel to the fourth side surface with a second chamfer line connected therebetween such that the second chamfer line is asymmetrical with respect to the second corner of the semiconductor substrate.

According to example embodiments, the main lines may be connected with each other by the asymmetrical chamfer line so that the crack detection circuit may not exist between the corner of the semiconductor substrate and a portion of the semiconductor substrate prone to the crack. Thus, although the crack may be generated in the corner of the semiconductor substrate by the twice cutting processes of the wafer, the crack detection circuit may not detect the crack. As a result, if the crack does not spread to the circuit structure through the crack detection circuit, the semiconductor chip including the normal circuit structure may not be falsely determined to be abnormal.

BRIEF DESCRIPTION OF THE DRAWINGS

Example embodiments will be more clearly understood from the following detailed description taken in conjunction with the accompanying drawings.

FIG. 1 is a plan view illustrating a semiconductor chip in accordance with example embodiments;

FIG. 2 is an enlarged plan view of a portion "II" in FIG. 1;

FIG. 3 is a plan view illustrating a semiconductor chip in accordance with example embodiments;

FIG. 4 is an enlarged plan view of a portion "IV" in FIG. 3;

FIG. 5 is a plan view illustrating a semiconductor chip in accordance with example embodiments;

FIG. 6 is an enlarged plan view of a portion "VI" in FIG. 5;

FIG. 7 is a plan view illustrating a semiconductor chip in accordance with example embodiments;

FIG. 8 is an enlarged plan view of a portion "VIII" in FIG. 7;

FIG. 9 is a plan view illustrating a semiconductor chip in accordance with example embodiments;

FIG. 10 is an enlarged plan view of a portion "X" in FIG. 9;

FIG. 11 is a plan view illustrating a semiconductor chip in accordance with example embodiments; and FIG. 12 is an enlarged plan view of a portion "XII" in FIG. 11.

DETAILED DESCRIPTION

Figure 1:
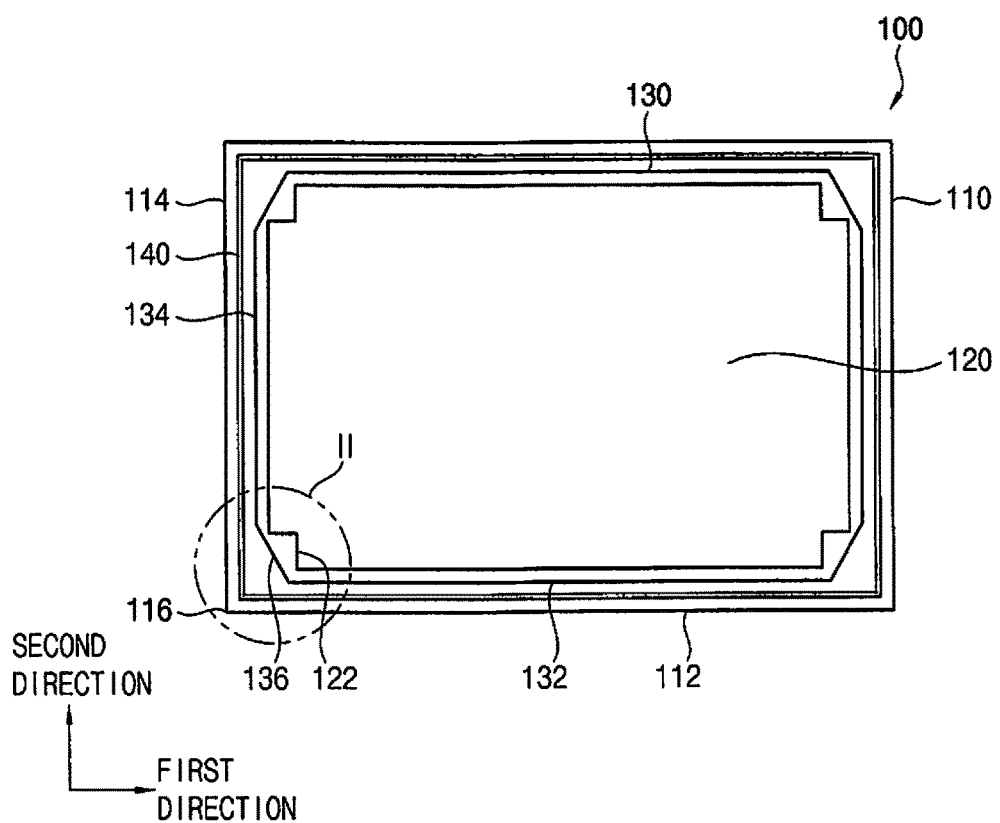
FIGS. 1 to 12 represent non-limiting, example embodiments as described herein.

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

Units and/or devices according to one or more example embodiments may be implemented using hardware, software, and/or a combination thereof. For example, hardware devices may be implemented using processing circuit such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network.

The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Hereinafter, example embodiments will be explained in detail with reference to the accompanying drawings.

Figure 2:
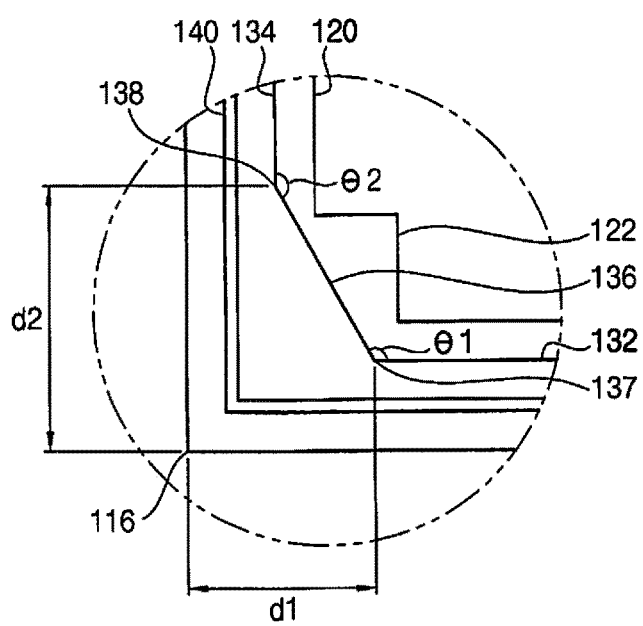

FIG. 1 is a plan view illustrating a semiconductor chip in accordance with example embodiments, and FIG. 2 is an enlarged plan view of a portion "II" in FIG. 1.

Referring to FIGS. 1 and 2, in some example embodiments, a semiconductor chip 100 may include a semiconductor substrate 110, a circuit structure 120, a crack detection circuit 130 and a guard ring 140.

The semiconductor substrate 110 may have a rectangular shape. Thus, the semiconductor substrate 110 may have a first side surface 112 and a second side surface 114 substantially perpendicular to the first side surface 112. The first side surface 112 may correspond to a long side surface of the semiconductor substrate 110. The second side surface 114 may correspond to a short side surface of the semiconductor substrate 110. Alternatively, the semiconductor substrate 110 may have a square shape.

Further, the semiconductor substrate 110 may have four corners 116. The first side surface 112 may extend in a first direction with respect to the corner 116. The second side surface 114 may extend in a second direction with respect to the corner 116, such that the second direction is substantially perpendicular to the first direction.

The circuit structure 120 may be formed in the semiconductor substrate 110. The circuit structure 120 may be arranged in a central portion of the semiconductor substrate 110. The circuit structure 120 may have a rectangular shape. Alternatively, the circuit structure 120 may have a square shape. However, example embodiments are not limited thereto. Thus, the circuit structure 120 may have outer surfaces oriented toward the first side surface 112 and the second side surface 114 of the semiconductor substrate 110. The circuit structure 120 may include volatile memory circuit, a non-volatile memory circuit, etc.

The corners 116 of the semiconductor substrate 110 may be prone to a crack. Thus, the crack may be generally generated at the corners 116 of the semiconductor substrate 110. For example, when a wafer including a plurality of the semiconductor chips 100 may be twice cut, namely cut along the first direction and cut along the second direction, the crack may be concentrated generated at the corners 116 of the semiconductor substrate 110.

Therefore, when corners of the circuit structure 120 may be arranged adjacent to the corners 116 of the semiconductor substrate 110, the circuit structure 120 may be damaged by the crack. In order to reduce (or, alternatively, prevent) the damage of the circuit structure 120, a chamfer face 122 may be formed at the corners of the circuit structure 120. Thus, the circuit structure 120 may not exist in an edge portion of the semiconductor substrate 110 adjacent to the corners 116 of the semiconductor substrate 110. In example embodiments, the chamfer face 122 may include a first face extended in the first direction, and a second face extended from the first face along the second direction.

The crack detection circuit 130 may be formed in the semiconductor substrate 110 to surround the circuit structure 120. The crack detection circuit 130 may be configured to detect the crack in the semiconductor substrate 110. For example, a power source (not shown) may supply a current to the crack detection circuit 130. When the crack generated from the first side surface 112 or the second side surface of the semiconductor substrate 110 may spread to the crack detection circuit 130, the crack detection circuit 130 may be disconnected. Thus, a current flowing through the crack detection circuit 130 may be changed so that the generation of the crack in the semiconductor substrate 110 may be detected.

The crack detection circuit 130 may include main lines and chamfer lines 136. The main lines may be arranged between the circuit structure 120 and the first and second side surfaces 112 and 114 of the semiconductor substrate 110. The main lines may include a pair of first main lines 132 and a pair of second main lines 134. The first main lines may be extended in a direction substantially parallel to the first side surface 112 of the semiconductor substrate 110. That is, the first main lines 132 may be extended in the first direction. The second main lines 134 may be extended in a direction substantially parallel to the second side surface 114 of the semiconductor substrate 110. That is, the second main lines 134 may be extended in the second direction. The first main lines 132 and the second main lines 134 may have a straight line shape.

Each of the chamfer lines 136 may be connected between the first main line 132 and the second main line 134. Thus, the chamber line 136 may include a first end 137 connected to the first main line 132, and a second end 138 connected to the second main line 134. The chamfer line 136 may have a straight line shape. The chamfer line 136 may be inclined with respect to the first main line 132 by a first angle θ1. In contrast, the chamfer line 136 may be inclined with respect to the second main line 134 by a second angle θ2. The first angle θ1 may be different from the second angle θ2. For example, the first angle θ1 may be smaller than the second angle θ2. Further, a first distance d1 from the corner 116 of the semiconductor substrate 110 to the first end 137 of the chamfer line 136 along the first direction may be different from a second distance d2 from the corner 116 of the semiconductor substrate 110 to the second end 138 of the chamfer line 136 along the second direction. For example, the first distance d1 may be shorter than the second distance d2. Therefore, the chamfer lines 136 may have an asymmetrical shape.

The crack detection circuit 130 may not exist in the portion of the semiconductor substrate 110 adjacent to the corners of the semiconductor substrate 110 due to the asymmetrical chamfer lines 136. When the second distance d2 is longer than the first distance d1, the second main line 134 may be further from the corner 116 than the first main line 132 such that a distance in which the second main line 134 may not exist may be longer than a distance in which the first main line 132 may not exist.

Often the wafer may initially be cut during a primary cutting operation along the first direction, and may subsequently be cut during a secondary cutting operation along the second direction. Thus, a force for supporting the wafer in the secondary cut process may become weaker than that in the primary cut process. Therefore, the crack may be more generated at the second side surface 114 than the first side surface 112 in the semiconductor substrate 110.

Because the crack may be generated at the second side surface 114 adjacent to the corners 116 of the semiconductor substrate 110 relatively more than at the first side surface 112 adjacent to the corners 116 of the semiconductor substrate 110, the chamfer line 136 may be provided with the aforementioned asymmetrical shape.

In other example embodiments, when the crack is relatively more likely to be generated at the first side surface 112 of the semiconductor substrate 110 than the second side surface 114 of the semiconductor substrate 110, the asymmetrical chamfer line 136 connected between the first main line 132 and the second main line 134 may be defined such that the first distance d1 is longer than the second distance d2.

Unlike example embodiments, when a chamfer line has a symmetrical shape, a first distance and a second distance defined by the symmetrical chamfer line may be substantially the same. In this case, a lower end of a second main line may be positioned under the lower end of the second main line 134 of this example embodiment toward the corner 116 of the semiconductor substrate 110. Thus, the second main line may be cut by the crack so that the crack detection circuit may detect the crack generated from the second side surface 114 of the semiconductor substrate 110. As a result, although the crack may not spread to the circuit structure 120, the semiconductor chip 100 including the normal circuit structure 120 may be determined to be abnormal due to the crack detection circuit.

However, in one or more example embodiments, using the asymmetrical chamfer line 130, the lower end of the second main line 134 may be positioned far enough away from the corner 116 of the semiconductor substrate 110 such that the crack generated from the second side surface 114 adjacent to the corner 116 of the semiconductor substrate 110 may not spread to the second main line 134. Thus, the second main line 134 may not be cut by the crack. As a result, when the crack may not spread to the circuit structure 120, the semiconductor chip 100 including the circuit structure 120 may be determined as being normal rather than incorrectly determined to be abnormal.

The guard ring 140 may be arranged between the crack detection circuit 130 and the first and second side surfaces 112 and 114 of the semiconductor substrate 110. The guard ring 140 may be extended in directions substantially parallel to the first and second side surfaces 112 and 114 of the semiconductor substrate 110. Thus, the guard ring 140 may have a rectangular parallelepiped shape. The guard ring 140 may protect the circuit structure 120.

Figure 3:
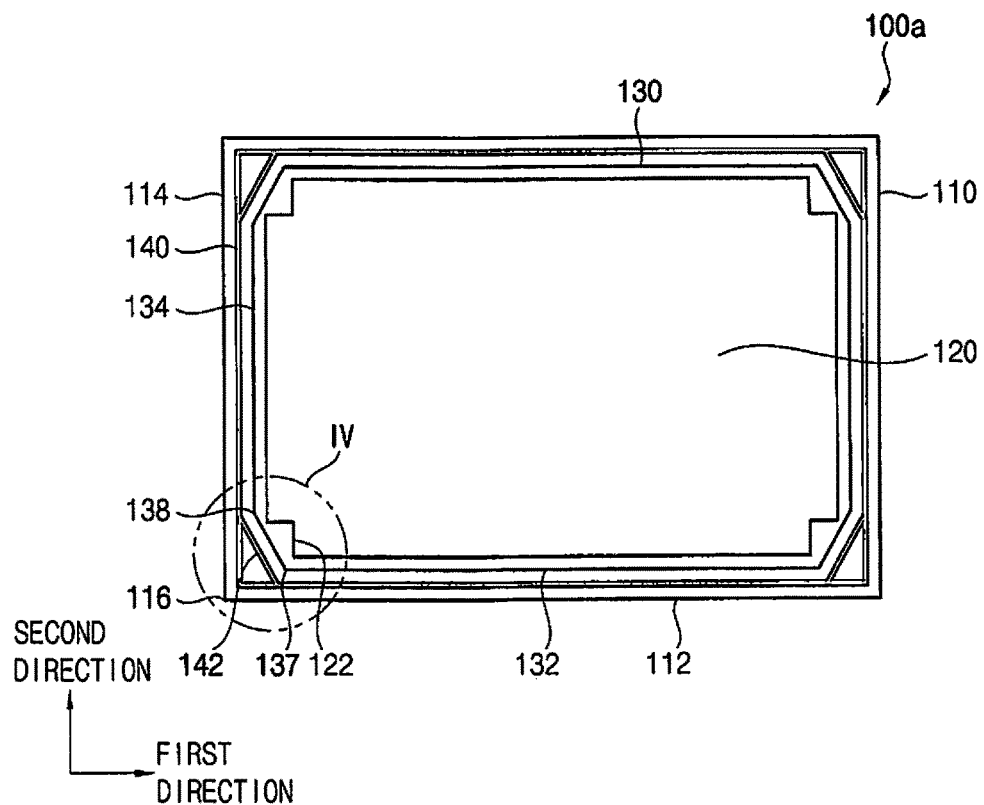
Figure 4:
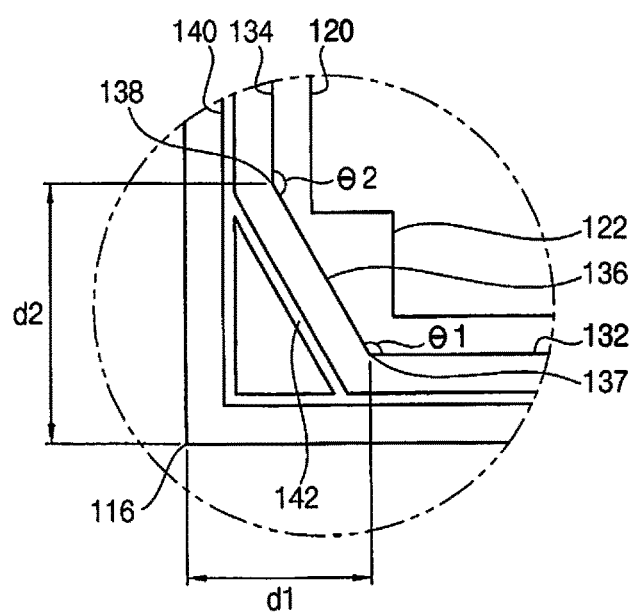

FIG. 3 is a plan view illustrating a semiconductor chip in accordance with example embodiments, and FIG. 4 is an enlarged plan view of a portion "IV" in FIG. 3.

In some example embodiments, a semiconductor chip 100a may include elements substantially the same as those of the semiconductor chip 100 in FIG. 1 except for further including an auxiliary guard ring. Thus, the same reference numerals may refer to the same elements and any further illustrations with respect to the same element may be omitted herein for brevity.

Referring to FIGS. 3 and 4, an auxiliary guard ring 142 may be formed at the corners 116 of the semiconductor substrate 110. The auxiliary guard ring 142 may be extended from the guard rings 140 that are substantially perpendicular to each other. The auxiliary guard ring 142 may be arranged adjacent to the outer surface of the chamfer line 136. The auxiliary guard ring 142 may have a straight line shape. A gap between the auxiliary guard ring 142 and the outer surface of the chamfer line 136 may be uniform (or, alternatively, substantially uniform) such that the auxiliary guard ring 142 and the chamfer line 136 are parallel to each other.

Figure 5:
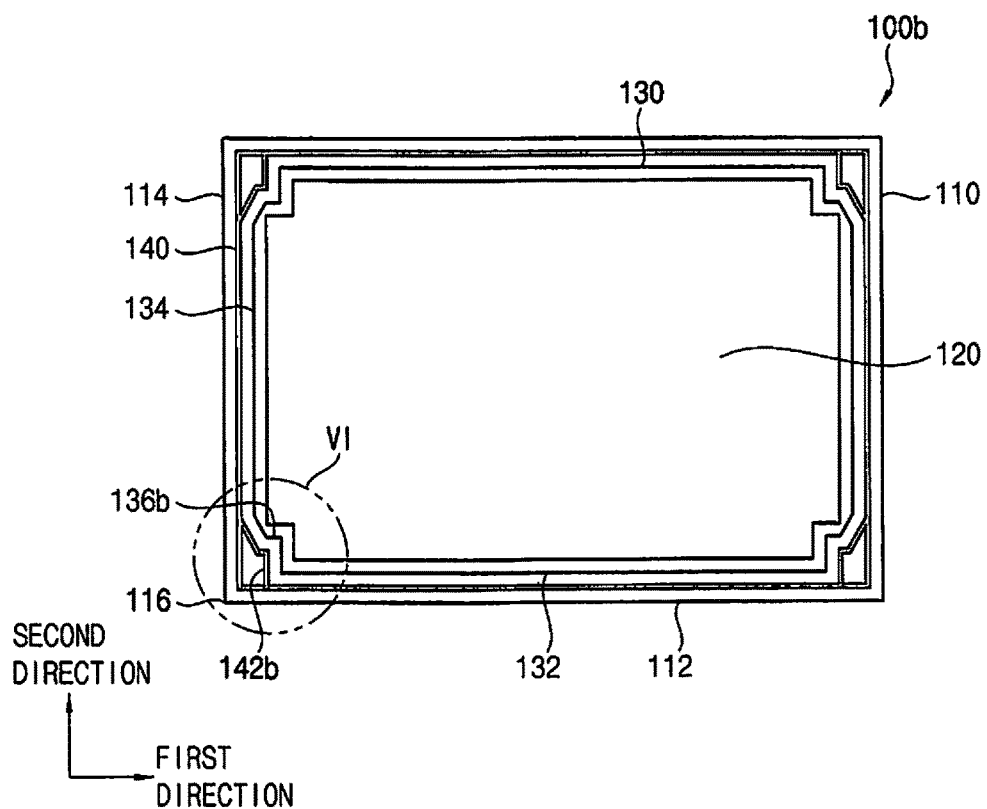
Figure 6:
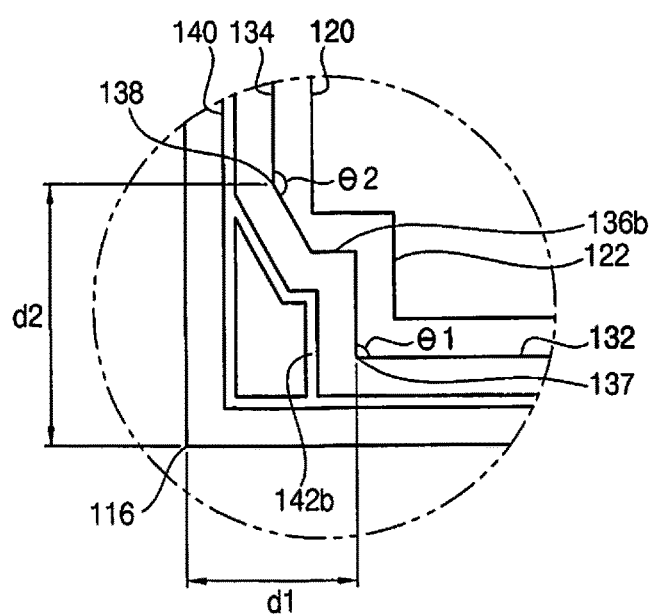

FIG. 5 is a plan view illustrating a semiconductor chip in accordance with example embodiments, and FIG. 6 is an enlarged plan view of a portion "VI" in FIG. 5.

In some example embodiments, a semiconductor chip 100b may include elements substantially the same as those of the semiconductor chip 100a in FIG. 3 except for a chamfer line and an auxiliary guard ring. Thus, the same reference numerals may refer to the same elements and any further illustrations with respect to the same element may be omitted herein for brevity.

Referring to FIGS. 5 and 6, a chamfer line 136b may be arranged adjacent to the chamfer face 122 of the circuit structure 120. The chamfer line 136b may be extended along the chamfer face 122 of the circuit structure 120. A gap between the chamfer line 136b and the chamfer face 122 of the circuit structure 120 may be uniform (or, alternatively, substantially uniform). As mentioned above, because the chamfer face 122 may have the two faces substantially perpendicular to each other, the chamfer line 136b may include two lines substantially perpendicular to each other corresponding to the perpendicular faces of the chamfer face 122 such that a distance between the chamfer line 136b and the chamber face 122 is uniform (or, alternatively, substantially uniform).

An auxiliary guard ring 142b may have a shape corresponding to the shape of the chamfer line 136b. Thus, a gap between the auxiliary guard ring 142b and the outer surface of the chamfer line 136b may be uniform (or, alternatively, substantially uniform).

Figure 7:
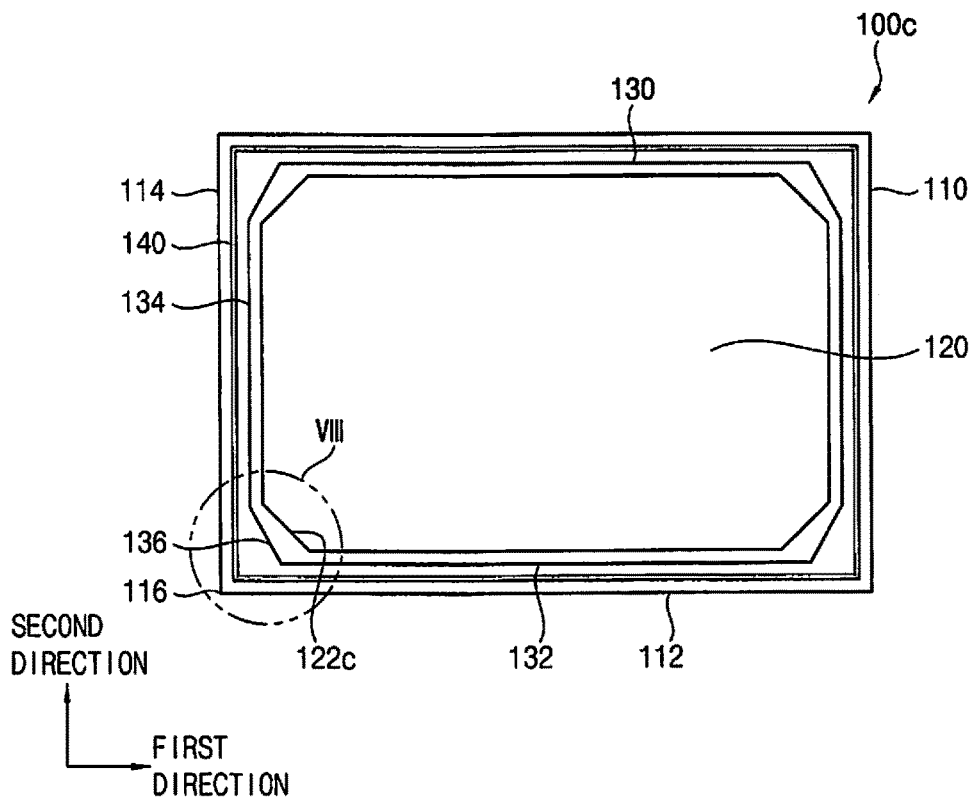
Figure 8:
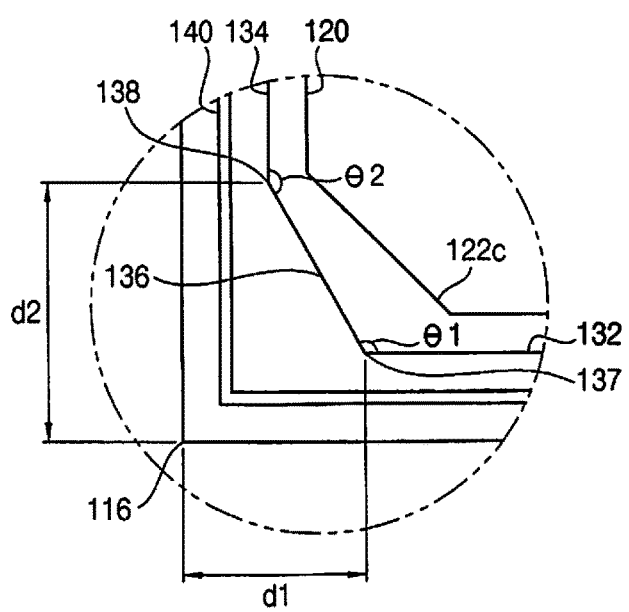

FIG. 7 is a plan view illustrating a semiconductor chip in accordance with example embodiments, and FIG. 8 is an enlarged plan view of a portion "VIII" in FIG. 7.

In some example embodiments, a semiconductor chip 100c may include elements substantially the same as those of the semiconductor chip 100 in FIG. 1 except for a chamfer face of a circuit structure. Thus, the same reference numerals may refer to the same elements and any further illustrations with respect to the same element may be omitted herein for brevity.

Referring to FIGS. 7 and 8, a chamfer face 122c of the circuit structure 120 may have a slanted face inclined to the outer surface of the circuit structure 120 at an angle of about 45°.

Figure 9:
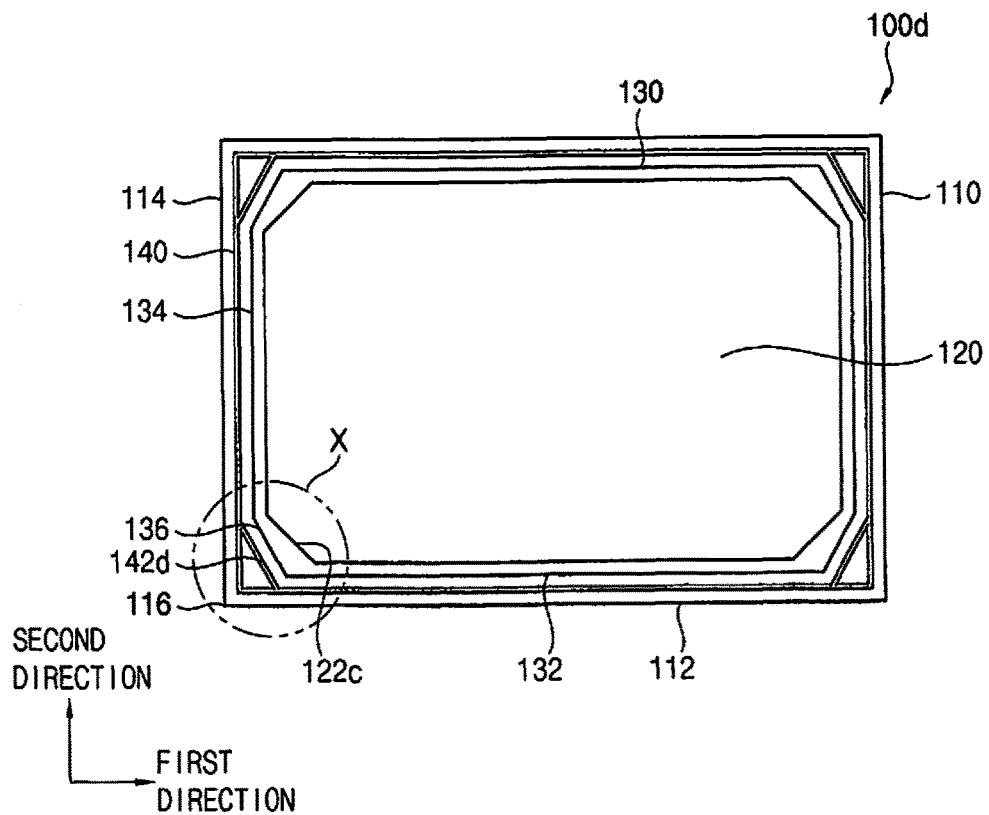
Figure 10:
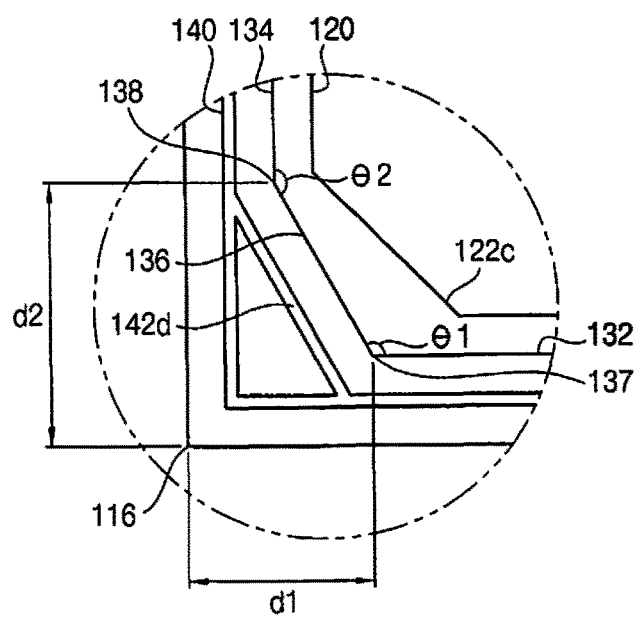

FIG. 9 is a plan view illustrating a semiconductor chip in accordance with example embodiments, and FIG. 10 is an enlarged plan view of a portion "X" in FIG. 9.

In some example embodiments, a semiconductor chip 100d may include elements substantially the same as those of the semiconductor chip 100c in FIG. 7 except for further including an auxiliary guard ring 142. Thus, the same reference numerals may refer to the same elements and any further illustrations with respect to the same element may be omitted herein for brevity.

Referring to FIGS. 9 and 10, an auxiliary guard ring 142d may be formed at the corners 116 of the semiconductor substrate 110. The auxiliary guard ring 142 may be extended from the guard rings 140 substantially perpendicular to each other. The auxiliary guard ring 142 may be arranged adjacent to the outer surface of the chamfer line 136. The auxiliary guard ring 142 may have a straight line shape. A gap between the auxiliary guard ring 142 and the outer surface of the chamfer line 136 may be uniform (or, alternatively, substantially uniform).

Figure 11:
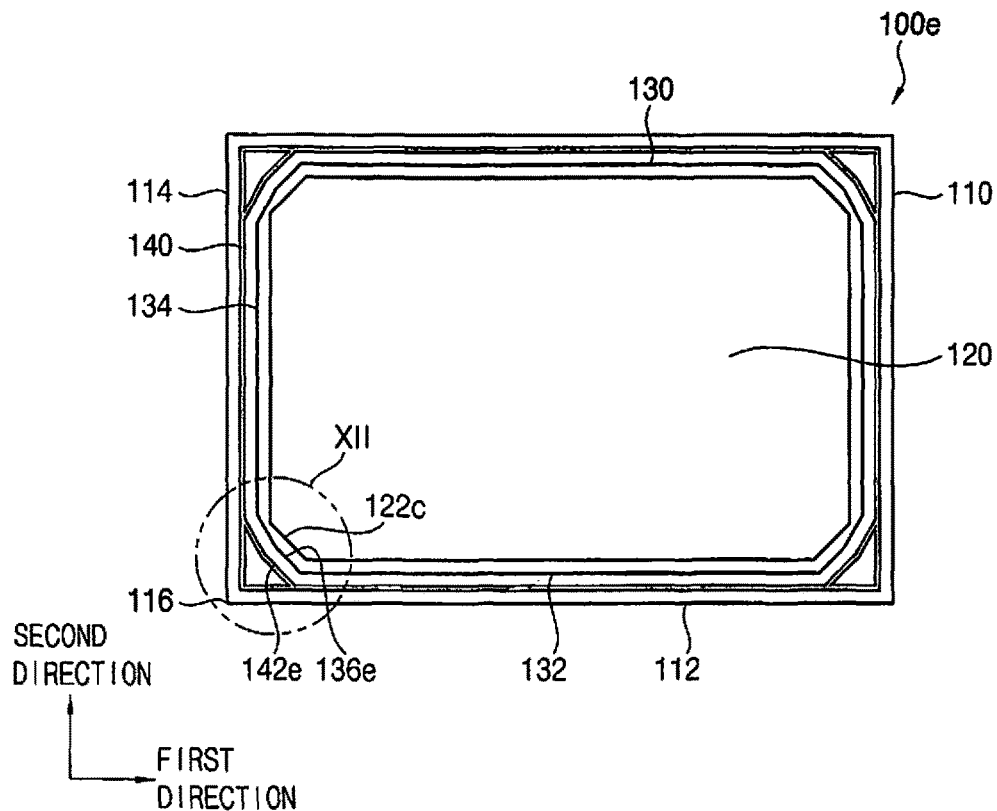
Figure 12:
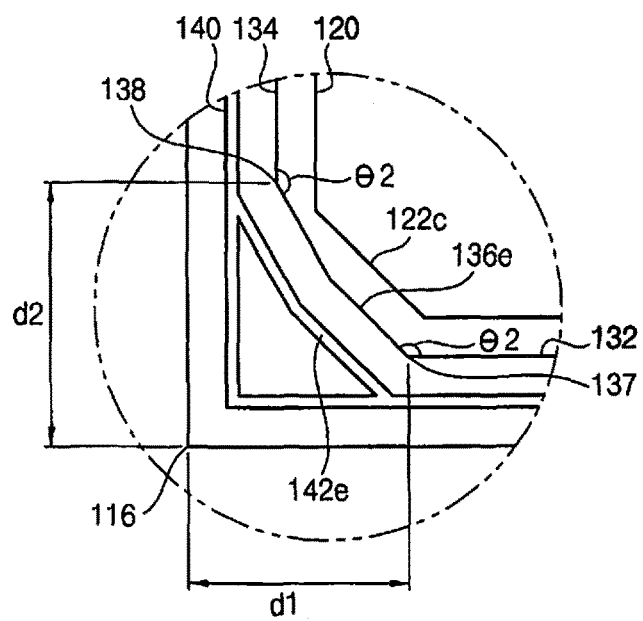

FIG. 11 is a plan view illustrating a semiconductor chip in accordance with example embodiments, and FIG. 12 is an enlarged plan view of a portion "XII" in FIG. 11.

In some example embodiments, a semiconductor chip 100e may include elements substantially the same as those of the semiconductor chip 100d in FIG. 9 except for a chamfer line and an auxiliary guard ring. Thus, the same reference numerals may refer to the same elements and any further illustrations with respect to the same element may be omitted herein for brevity.

Referring to FIGS. 11 and 12, a chamfer line 136e may be arranged adjacent to the chamfer face 122c of the circuit structure 120. The chamfer line 136e may be extended along the chamfer face 122c of the circuit structure 120. A gap between the chamfer line 136e and the chamfer face 122c of the circuit structure 120 may be uniform (or, alternatively, substantially uniform). As mentioned above, because the chamfer face 122c may have the slanted face, the chamfer line 136e may include slant lines corresponding to the slant chamfer face 122c.

An auxiliary guard ring 142e may have a shape corresponding to the shape of the chamfer line 136e. Thus, a gap between the auxiliary guard ring 142e and the outer surface of the chamfer line 136e may be uniform (or, alternatively, substantially uniform).

As discussed above in regards to FIGS. 1-12, in example embodiments, the chamfer line may have the straight shape, a bent shape, a curved shape, etc.

According to example embodiments, the main lines may be connected with each other by the asymmetrical chamfer line so that the crack detection circuit 130 may not exist between the corner 116 of the semiconductor substrate 110 and a portion of the semiconductor substrate prone to the crack. Thus, although the crack may be generated in the corner of the semiconductor substrate 110 by the twice cutting processes of the wafer, the crack detection circuit 130 may not detect the crack. As a result, when the crack may not spread to the circuit structure 120 through the crack detection circuit 130, the semiconductor chip including the circuit structure 120 that is normal may not be determined to be abnormal. For example, the crack detection circuit 130 may more accurately detect whether a crack is substantial enough to cause a malfunction of the circuit structure 120.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor chip comprising:
   a semiconductor substrate;
   a circuit structure; and
   a crack detection circuit including main lines and chamfer lines associated with the semiconductor substrate, the main lines including first main lines and second main lines around the circuit structure, the first main lines substantially perpendicular to the second main lines, and each of the chamfer lines connected between a respective one of the first main lines and one of the second main lines at corners of the semiconductor substrate such that, at least at one of the corners, the chamfer lines are inclined with respect to the one of the first main lines at a first angle and inclined with respect to the one of the second main lines at a second angle, the second angle being greater than the first angle.

2. The semiconductor chip of claim 1, wherein
   the first main lines extend in a direction substantially parallel to a primary cut direction of a wafer associated with the semiconductor substrate, and
   the second main lines extend in a direction substantially parallel to a secondary cut direction of the wafer.

3. The semiconductor chip of claim 1, wherein at least one of the chamfer lines is shaped in a straight line.

4. The semiconductor chip of claim 1, wherein at least one of the chamfer lines is along a portion of a perimeter of the circuit structure.

5. The semiconductor chip of claim 1, wherein the circuit structure comprises:
   a chamfer face at a corner of the circuit structure adjacent to a corresponding corner of the semiconductor substrate.

6. The semiconductor chip of claim 5, wherein the chamfer lines are such that a gap between a respective one of the chamfer lines and an adjacent side of the circuit structure is uniform.

7. The semiconductor chip of claim 1, further comprising:
   a guard ring between the crack detection circuit and side surfaces of the semiconductor substrate.

8. The semiconductor chip of claim 7, further comprising:
   auxiliary guard rings extended from the guard ring at each of the corners of the semiconductor substrate such that the each of the auxiliary guard rings is adjacent to one of the chamfer lines.

* * * * *